United States Patent
Yon et al.

(10) Patent No.: US 10,981,782 B2
(45) Date of Patent: Apr. 20, 2021

(54) PROCESS FOR FABRICATING A DEVICE FOR DETECTING ELECTROMAGNETIC RADIATION HAVING AN IMPROVED ENCAPSULATION STRUCTURE

(71) Applicant: Commissariat A L'Energie Atomique et aux Energies Alternatives, Paris (FR)

(72) Inventors: Jean-Jacques Yon, Grenoble (FR); Geoffroy Dumont, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/598,197

(22) Filed: Oct. 10, 2019

(65) Prior Publication Data
US 2020/0115225 A1    Apr. 16, 2020

(30) Foreign Application Priority Data
Oct. 12, 2018    (FR) .................................... 18 59483

(51) Int. Cl.
*B81C 1/00*    (2006.01)
*B81B 7/00*    (2006.01)

(52) U.S. Cl.
CPC ........ *B81C 1/00325* (2013.01); *B81B 7/0051* (2013.01); *B81B 2201/0278* (2013.01); *B81B 2203/0127* (2013.01); *B81C 2201/0108* (2013.01); *B81C 2203/0136* (2013.01)

(58) Field of Classification Search
None
See application file for complete search history.

(56) References Cited

U.S. PATENT DOCUMENTS

| 8,183,474 B2 * | 5/2012 | Gillot .................... B81B 3/007 174/544 |
| 2007/0235501 A1 * | 10/2007 | Heck .................. B81C 1/00293 228/101 |
| 2008/0041607 A1 | 2/2008 | Robert |
| 2014/0264712 A1 * | 9/2014 | Boutami .............. G01J 5/0806 257/467 |
| 2016/0245702 A1 | 8/2016 | Dumont et al. |

FOREIGN PATENT DOCUMENTS

| EP | 1 694 597 A1 | 8/2006 |
| EP | 3 067 675 A2 | 9/2016 |

OTHER PUBLICATIONS

French Preliminary Search Report dated Jul. 29, 2019 in French Application 18 59483 filed on Oct. 12, 2018 (with English Translation of Categories of Cited Documents & Written Opinion).
Barres, T, "Caracterisation de la nano-porosite de couches minces de nitrure de silicium. Une approche multi-echelles", Physique [physics]. Universite Pierre et Marie Curie-Paris VI, 2017, 255 pages.
Dumont, G, et al., "Innovative on-chip packaging applied to uncooled IRFPA", Infrared Technology and Applications XXXIV, Proc. of SPIE vol. 6940, 2008, 6 pages.

* cited by examiner

*Primary Examiner* — Jay C Chang
(74) *Attorney, Agent, or Firm* — Oblon, McClelland, Maier & Neustadt, L.L.P.

(57) ABSTRACT

A process for fabricating a device for detecting electromagnetic radiation, including an encapsulation structure including an encapsulation layer on which a relief rests, and a sealing layer, which has a local breakage in continuity at the relief.

11 Claims, 5 Drawing Sheets

PROCESS FOR FABRICATING A DEVICE FOR DETECTING ELECTROMAGNETIC RADIATION HAVING AN IMPROVED ENCAPSULATION STRUCTURE

TECHNICAL FIELD

The field of the invention is that of processes for fabricating devices for detecting electromagnetic radiation, in particular infrared or terahertz radiation, comprising an encapsulation structure that forms a cavity in which at least one thermal detector is housed. The invention is notably applicable to the field of infrared or terahertz imaging, of thermography, or even of gas detection.

PRIOR ART

Devices for detecting electromagnetic radiation, for example infrared or terahertz radiation, may comprise a matrix array of thermal detectors each comprising a membrane able to absorb the electromagnetic radiation to be detected and containing a thermometric transducer such as a thermistor material. To ensure the thermal insulation of the thermometric transducers with respect to the read substrate, the absorbing membranes are conventionally suspended above the substrates by anchoring pillars, and are thermally insulated therefrom by thermally insulating arms. These anchoring pillars and thermally insulating arms also have an electrical function since they connect the absorbing membranes to the read circuit, which is generally placed in the substrate.

To ensure optimal operation of the thermal detectors, a low pressure level may be required. To this end, the thermal detectors are generally confined, or encapsulated, alone or in a group of more than one thereof, in at least one hermetic cavity that is under vacuum or at a low pressure. The hermetic cavity is defined by an encapsulation structure, also called a capsule, as illustrated in the document by Dumont et al, *Current progress on pixel level packaging for uncooled IRFPA*, Proc. SPIE 8353, Infrared Technology and Applications XXXVIII, 835311, 2012, for a configuration in which the encapsulation structure defines a plurality of hermetic cavities each encapsulating a single thermal detector (configuration referred to as "pixel level packaging").

Figure 1:
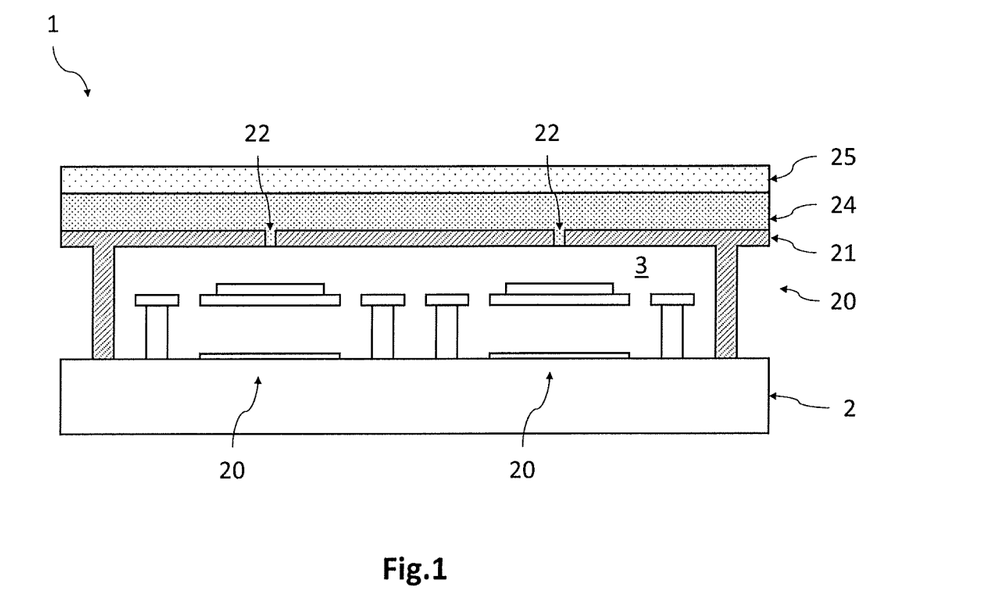
FIG. 1, which has already been described, is a schematic and partial cross-sectional view of a detecting device according to one example of the prior art.

U.S. Pat. No. 9,933,309 describes another example of a detecting device 1 in which the encapsulation structure 20 defines a hermetic cavity 3 encapsulating a matrix array of thermal detectors 10. As illustrated in FIG. 1, the encapsulation structure 20 then comprises a thin encapsulation layer 21 that defines, with the substrate 2, the hermetic cavity 3. The thin encapsulation layer 21 comprises a plurality of release vents allowing the evacuation, out of the cavity 3, of the sacrificial layers used during the fabricating process. A thin sealing layer 24 at least partially covers the encapsulation layer and ensures the hermeticity of the cavity by blocking the release vents 22. The thin encapsulation and sealing layers 21, 24 are made of materials that are transparent to the electromagnetic radiation to be detected. A thin antireflection layer 25 may cover the thin sealing layer 24.

The thin encapsulation and sealing layers may be made of different materials, for example amorphous silicon for the encapsulation layer and germanium for the sealing layer, which then have different coefficients of thermal expansion (CTEs). In point of fact, the process for fabricating such a detecting device may comprise one or more steps in which the device being produced is exposed to high temperatures. It may thus be a question, purely by way of illustration, of the activation at about 300° C. of a getter material located in the hermetic cavity 3, this getter material being intended to react with residual gas potentially present in the cavity in order to keep the latter at a sufficient vacuum level. It turns out that the difference in CTEs between the materials of the encapsulation and sealing layers may then generate mechanical stresses in the encapsulation structure, which may cause its mechanical strength to weaken.

SUMMARY OF THE INVENTION

The objective of the invention is to at least partially remedy the drawbacks of the prior art, and more particularly to provide a process for fabricating such a detecting device allowing the mechanical strength of the encapsulation structure to be increased.

To this end, one subject of the invention is a process for fabricating a device for detecting electromagnetic radiation comprising at least one thermal detector resting on a substrate and one encapsulation structure defining, with the substrate, a cavity in which the thermal detector is located. The process comprises the following steps:
   producing the thermal detector from at least one first sacrificial layer deposited on the substrate;
   producing a thin encapsulation layer of the encapsulation structure extending above the thermal detector from at least one second sacrificial layer resting on the first sacrificial layer, the thin encapsulation layer being made of an encapsulation material;
   producing, by physical vapour deposition, a thin "sealing" layer covering the thin encapsulation layer the thin sealing layer being made of a sealing material having a coefficient of thermal expansion different from that of the encapsulation material.

According to the invention, the process furthermore comprises the following step:
   prior to the step of producing the thin sealing layer, producing at least one relief on the thin encapsulation layer having a suitable average thickness so that, during the deposition of the thin sealing layer, the latter has a local breakage in continuity at the relief.

The following are certain preferred but non-limiting aspects of this fabricating process.

The relief may form a two-dimensional array of longitudinal segments at least partially encircling the thermal detector in orthogonal projection with respect to the substrate.

In orthogonal projection with respect to the substrate, the array of longitudinal segments of the relief may encircle the thermal detector continuously.

The thermal detector may comprise an absorbent membrane suspended above the substrate and containing a thermometric transducer, the relief being placed at a distance, in orthogonal projection with respect to the substrate, from the absorbent membrane.

The thin sealing layer may have an average thickness $e_{cs}$, the relief having an average thickness $e_r$ larger than or equal to one fifth of the average thickness $e_{cs}$.

The step of producing the relief may comprise depositing a first layer made of a material different from that of the thin encapsulation layer, then locally structuring the first layer by etching it selectively vis-à-vis the thin encapsulation layer so as to form the relief.

The detecting device may comprise a matrix array of thermal detectors placed in said cavity, the relief forming a two-dimensional array of longitudinal segments at least partially encircling each of the thermal detectors in orthogonal projection with respect to the substrate.

The thin encapsulation layer may be silicon-based and the thin sealing layer be germanium-based.

The thin sealing layer is preferably deposited by evaporation.

The fabricating process may comprise a step of producing a thin antireflection layer by physical vapour deposition on the thin sealing layer, the thin antireflection layer then having a local breakage in continuity.

The fabricating process may comprise:

between the step of producing the relief and the step of producing the thin sealing layer, a step of forming at least one through-orifice called the release vent through the thin encapsulation layer, the thin sealing layer then being produced so as to block the release vent, a step of removing the sacrificial layers through the release vent.

BRIEF DESCRIPTION OF THE DRAWINGS

Other aspects, aims, advantages and features of the invention will become more clearly apparent on reading the following detailed description of preferred embodiments thereof, which is given by way of non-limiting example, and with reference to the appended drawings, in which.

DETAILED DESCRIPTION OF PARTICULAR EMBODIMENTS

In the figures and in the rest of the description, the same references have been used to reference elements that are identical or similar. In addition, the various elements are not shown to scale for the sake of the clarity of the figures. Moreover, the various embodiments and variants are not exclusive of one another and may be combined together. Unless otherwise indicated, the terms "substantially", "about" and "of the order of" mean to within 10%, and preferably to within 5%. Moreover, the expression "comprising a/an" must be understood, unless otherwise indicated, to mean "comprising at least one" and not to mean "comprising a single".

The invention relates to a process for fabricating a device for detecting electromagnetic radiation. The detecting device comprises at least one thermal detector that is encapsulated, alone or in a group of more than one thereof, in a cavity that is advantageously hermetic and defined by an encapsulation structure. The thermal detector may be suitable for detecting infrared or terahertz radiation. It may in particular detect infrared radiation in the long-wavelength infrared band (LWIR band), which extends from about 7 µm to 14 µm.

FIGS. 2A to 2J illustrate various steps in a process for fabricating a detecting device 1 according to one embodiment.

Figure 2A:
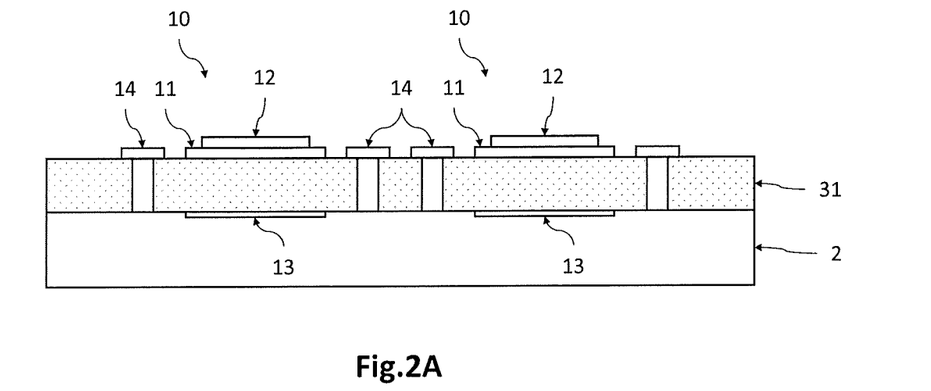
FIGS. 2A to 2J illustrate, in schematic and partial cross-sectional view, various steps in a process for fabricating the detecting device according to one embodiment.

In this embodiment, each thermal detector 10 comprises an absorbent membrane 11 containing a thermometric transducer 12 suitable for detecting infrared radiation in the LWIR band. The thermometric transducer 12 is an element having an electrical property that varies with its temperature, and is here a thermistor material formed for example from titanium or vanadium oxide, or from amorphous silicon. As a variant, this may be a capacitor formed by a ferroelectric or pyroelectric material, of a diode (p-n or p-i-n junction), or even of a metal-oxide-semiconductor field-effect transducer (MOSFET).

Moreover, the thermal detector 10 here has a configuration in which the thermometric transducer 12 is placed in a membrane that is suspended above the read substrate 2 and suitable for absorbing the electromagnetic radiation to be detected. The absorbent membrane 11 is located in the same plane as the thermally insulating arms. Other configurations are possible, for example a configuration in which the absorbent membrane 11 is located above the thermally insulating arms, as notably described in application WO2018/055276, or even a configuration in which the absorber is separate from and placed above the membrane containing the thermometric transducer 12, as for example described in US2009140147.

The detecting device 1 here comprises a matrix array of thermal detectors 10 forming sensitive pixels. The encapsulation structure 20 defines a preferably hermetic cavity 3 that encapsulates the matrix array of thermal detectors 10. As a variant, the detecting device 1 may comprise a plurality of cavities each encapsulating a single thermal detector 10, as notably described in the aforementioned paper by Dumont et al. 2012.

Here, and for the rest of the description, a three-dimensional direct coordinate system (X,Y,Z), in which the XY-plane is substantially parallel to the plane of the read substrate 2 of the detecting device 1 is defined, the Z-axis being oriented in a direction substantially orthogonal to the XY-plane of the read substrate 2. Moreover, the terms "lower" and "upper" will be understood to be relative to positions that are nearer to and further from the read substrate 2 in the +Z direction.

In this example, the thermal detectors 10 are produced using mineral sacrificial layers 31, 32 that are subsequently intended to be removed by wet etching in an acid medium (HF vapour). Other techniques may be used, such as the use of sacrificial layers made of polyimide or equivalent, which are then removed by dry etching, in $O_2$ plasma for example.

With reference to FIG. 2A, the matrix array of thermal detectors 10 is first produced by means of at least one first sacrificial layer 31 deposited on the substrate 2. This step is identical or similar to that notably described in U.S. Pat. No. 9,933,309.

The detecting device 1 comprises a read substrate 2, which in this example is silicon-based, containing an electronic circuit (not shown) allowing the thermal detector 10 to be controlled and read. The read circuit here takes the form of an integrated CMOS circuit located in a carrier substrate. It comprises line segments that are conductive, and for example made of metal, and that are separated from one another by a dielectric material, for example a silicon-based mineral material such as a silicon oxide $SiO_x$, a silicon nitride $SiN_x$, or alloys thereof. It may also comprise active or passive electronic elements (not shown), for example diodes, transistors, capacitors, resistors, etc., that are connected by electrical interconnects to the thermal detector 10 on the one hand, and to a connection pad (not shown) on the other hand, the latter being intended to connect the detecting system to an external electronic device.

The reflective 13 of each thermal detector 10 is also produced. The reflective 13 is here formed by a segment of a conductive line of the last interconnect level, said segment being made of a material suitable for reflecting the electromagnetic radiation to be detected. It lies facing the absorbent membrane 11, and is intended to form therewith a quarter-wave interference cavity for the electromagnetic radiation to be detected.

If the inter-metal dielectric layers are made of a mineral material, and if the sacrificial layers 31, 32 used to produce the thermal detectors 10 and the encapsulation structure 20 are also made of a mineral material, the upper face of the read substrate 2 is covered with a protective layer (not shown). The latter here corresponds to an etch-stop layer made of a material that is substantially inert with respect to the chemical etchant used subsequently to remove the mineral sacrificial layers, inert with respect to the vapour-phase HF medium for example. This protective layer thus forms a chemically inert, hermetic layer. It is electrically insulating in order to prevent any short-circuit between the conductive line segments. It thus makes it possible to prevent the subjacent mineral insulating layers from being etched during this step of removing the sacrificial layers. It may be formed from an aluminum nitride or oxide, from aluminum trifluoride or nitride, or from unintentionally doped amorphous silicon.

Firstly, a first sacrificial layer 31 is deposited on the read substrate 2, which layer is for example made of a mineral material such as a silicon oxide $SiO_x$ deposited by plasma enhanced chemical vapour deposition (PECVD). This mineral material is able to be removed by wet chemical etching, in particular by chemical etching in an acid medium, the etchant preferably being vapour-phase hydrofluoric acid (HF). This mineral sacrificial layer 31 is deposited so as to extend continuously over substantially all the surface of the read substrate 2 and to thus cover the protective layer. The thickness of the sacrificial layer 31 along the Z-axis may be of the order of a few hundred nanometres to a few microns.

Next, the following are produced: the anchoring pillars 14 through the sacrificial layer 31, the thermally insulating arms (not shown) and the absorbent membrane 11 that rest on the sacrificial layer 31. The absorbent membrane 11 is intended to be suspended above the read substrate 2 by the anchoring pillars 14, and is thermally insulated from the read substrate 2 by the thermally insulating arms. The anchoring pillars 14 are electrically conductive, and pass through the protective layer locally in order to make an electrical contact with the read circuit. The absorbent membrane 11 is spaced apart from the read substrate 2, and in particular the reflective layer, by a non-zero distance. This distance is preferably adjusted so as to form a quarter-wave interference cavity that optimizes the absorption of the electromagnetic radiation to be detected by the membrane 11. It is typically between 1 μm and 5 μm, and is preferably 2 μm, when the thermal detector 10 is designed to detect infrared radiation in the LWIR band. The absorbent membrane 11 incorporates a thermistor material, which is connected to the read circuit by way of the thermally insulating arms and the anchoring pillars 14.

Next, the encapsulation structure 20 is produced. Generally, the encapsulation structure 20, or capsule, defines with the read substrate 2 a cavity 3 that is advantageously hermetic and within which, here, is the matrix array of thermal detectors 10. The encapsulation structure 20 comprises at least one thin encapsulation layer 21 covered by at least one thin sealing layer 24. The thin encapsulation and sealing layers 21, 24 are made of different materials, having different coefficients of thermal expansion (CTEs). By way of example, the thin encapsulation layer 21 may be made of amorphous silicon and the thin sealing layer 24 may be made of germanium. By thin layer, what is meant is a layer deposited using the techniques used to deposit materials employed in the field of microelectronics, and the thickness of which is preferably smaller than 10 μm.

Figure 2B:
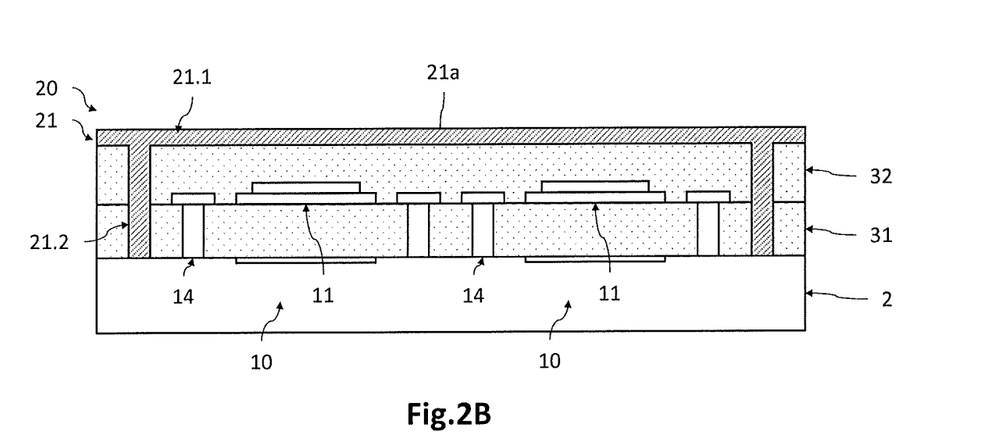

With reference to FIG. 2B, a second sacrificial layer 32, preferably of the same nature as the first sacrificial layer 31, is first deposited. The sacrificial layer 32 covers the sacrificial layer 31 and also the absorbent membrane 11 and the thermally insulating arms. Using conventional photolithography techniques, the sacrificial layers 31, 32 are then etched locally to the surface of the read substrate 2 (or to tie segments placed on the substrate). The etched zones may take the form of trenches of continuous and closed perimeter encircling the matrix array of thermal detectors 10.

Next, the thin encapsulation layer 21, which here is made of amorphous silicon, and which covers both the upper surface of the sacrificial layer 32 and the flanks of the trenches, is deposited, for example by chemical vapour deposition (CVD). The thin encapsulation layer 21 comprises an upper wall 21.1 that lies above and a distance from the thermal detectors 10, and a side wall 21.2 that encircles, in the XY-plane, the matrix array of thermal detectors 10, preferably continuously. The upper wall 21.1 is substantially planar and lies above the thermal detectors 10, at a non-zero distance from the suspended membranes, which distance is for example comprised between 0.5 μm and 5 μm, preferably between 0.5 μm in 3.5 μm, and preferably equal to 1.5 μm. The side wall 21.2 is here peripheral so as to encircle the thermal detectors 10 in the XY-plane. It extends from the upper wall 21.1 to rest locally on the read substrate 2. The thin encapsulation layer 21 therefore extends, in this example, continuously above and around the matrix array of thermal detectors 10 so as to define the cavity 3 with the read substrate 2. The thin encapsulation layer 21 is made of a material that is transparent to the electromagnetic radiation to be detected, here of amorphous silicon, and has an average thickness that is advantageously equal to an uneven multiple of $\lambda/4n_{ce}$, where $\lambda$ is a central wavelength of the detection band of the electromagnetic radiation of interest, for example 10 μm in the case of the LWIR band, and $n_{ce}$ is the refractive index of the material of the thin encapsulation layer 21. It may be between a few hundred nanometres and a few microns, and for example is equal to about 800 nm.

Figure 2C:
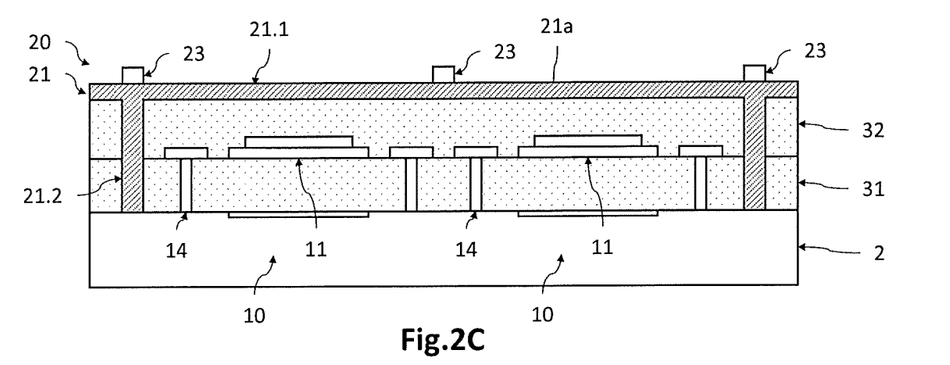
Figure 2D:
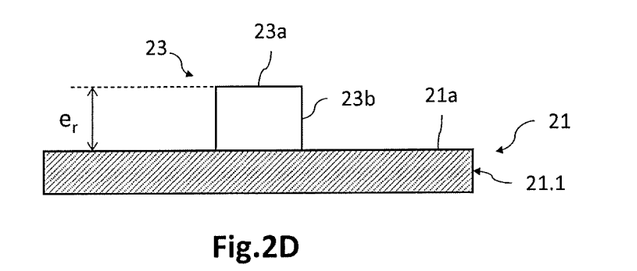
Figure 2E:
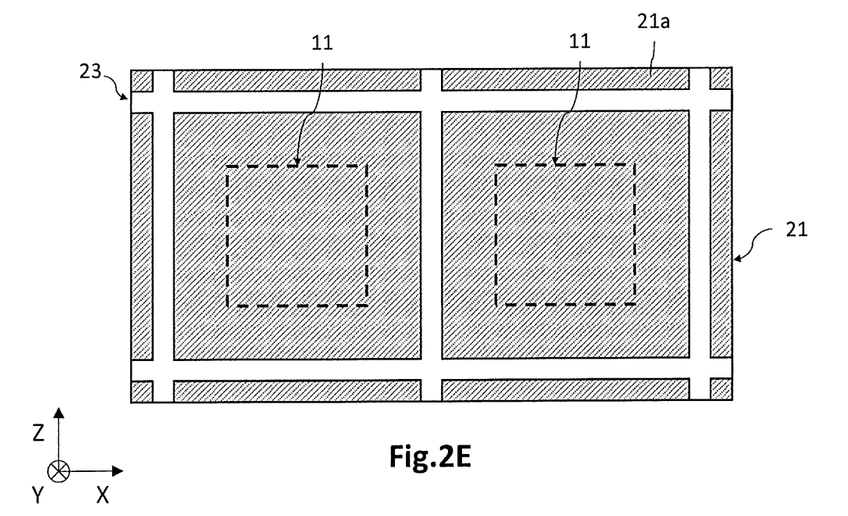

With reference to FIGS. 2C, 2D and 2E, the relief 23 is then produced on the thin encapsulation layer 21, and more precisely on the upper wall 21.1 thereof. By relief 23, what is meant is a segment of a material extending locally over the thin encapsulation layer 21, forming a protrusion from the upper face 21a. It advantageously has an upper face 23a that lies substantially parallel to the upper face 21a of the thin encapsulation layer 21 on which it rests. The upper face 23a is bordered by lateral faces 23b that extend substantially orthogonally to the thin encapsulation layer 21. Thus, the relief 23 may then have a cross section in a transverse plane parallel to the Z-axis of a substantially rectangular or square shape. A local thickness is then defined as being the local dimension of the relief 23 along the Z-axis. The average thickness $e_r$ is defined as being the average of the local thicknesses. This average thickness $e_r$ is chosen so as to provoke a local breakage in the continuity of the thin sealing layer 24 produced subsequently by physical vapour deposition.

To this end, a layer made of a material different from the material of the thin encapsulation layer 21 and having an etch selectivity with respect thereto is preferably deposited. Next, by photolithography and etching, the deposited layer is structured locally so as to form the relief 23 on the thin encapsulation layer 21. The relief 23 may be one or more longitudinal segments that extend over the thin encapsulation layer 21. By longitudinal segment, what is meant is a volume of material that has a longitudinal dimension larger than the transverse dimensions of width and of thickness. The longitudinal segments are preferably contiguous and continuous with one another, but may as a variant be separate from one another. The relief 23 may also be formed from one or more separate segments having dimensions of the same order in the XY-plane.

Preferably, the relief 23 forms a two-dimensional array, and therefore one that extends along two transverse axes parallel to the XY-plane, of longitudinal segments that at least partially encircle, in orthogonal projection, each thermal detector 10. By in orthogonal projection, or in orthogonal projection with respect to the substrate, what is meant is in projection along the Z-axis in a plane parallel to the plane of the substrate 2. By at least partially, what is meant is that the longitudinal segments of the relief 23 encircle only one portion of the thermal detector 10 in the XY-plane. The longitudinal segments may thus be separate from one another. Preferably, the longitudinal segments of the relief 23 encircle, in orthogonal projection, each thermal detector 10 continuously. Thus, they are joined to one another and thus have a continuity of material therebetween.

Preferably, the relief 23 is placed at a distance, in orthogonal projection, from the thermal detectors 10, and preferably from the absorbent membranes 11, so as not to disrupt the transmission of the electromagnetic radiation to be detected. In other words, the relief 23 is placed plumb with a zone containing no absorbent membranes 11. It may thus be placed plumb with the anchoring pillars 14, or even plumb with a zone passing between the anchoring pillars 14 of two neighbouring thermal detectors 10.

The relief 23 has an average thickness $e_r$ chosen so that, during the subsequent production of the thin sealing layer 24 by physical vapour deposition on the thin encapsulation layer 21 and on the relief 23, the presence of the relief 23 causes a local breakage in the continuity of the thin sealing layer 24, i.e. a discontinuity in the material of the thin sealing layer 24 in the XY-plane at the relief 23. The relief 23 has an average thickness $e_r$ larger than or equal to about one fifth of the average thickness $e_{cs}$ of the thin sealing layer 24, preferably larger than or equal to one quarter, and preferably larger than or equal to about half of the average thickness $e_{cs}$. By way of example, in the case of a thin sealing layer 24 having an average thickness of 1800 nm, the relief 23 may have a thickness larger than or equal to 400 nm, for example equal to about 800 nm, or even to 1000 nm.

Figure 2F:
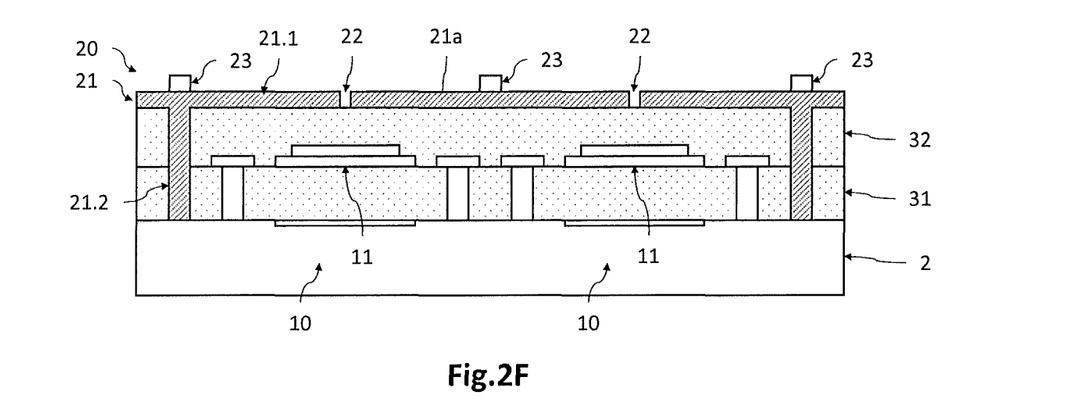

With reference to FIG. 2F, local etching of the thin encapsulation layer 21 is then carried out so as to produce through-orifices forming the release vents 22. Each release vent 22 is here advantageously positioned facing the centre of an absorbent membrane 11. The absorbent membrane 11 may then be structured so as to have a through-orifice (not shown) located facing the release vent 22, as described in document EP3067675.

Figure 2G:
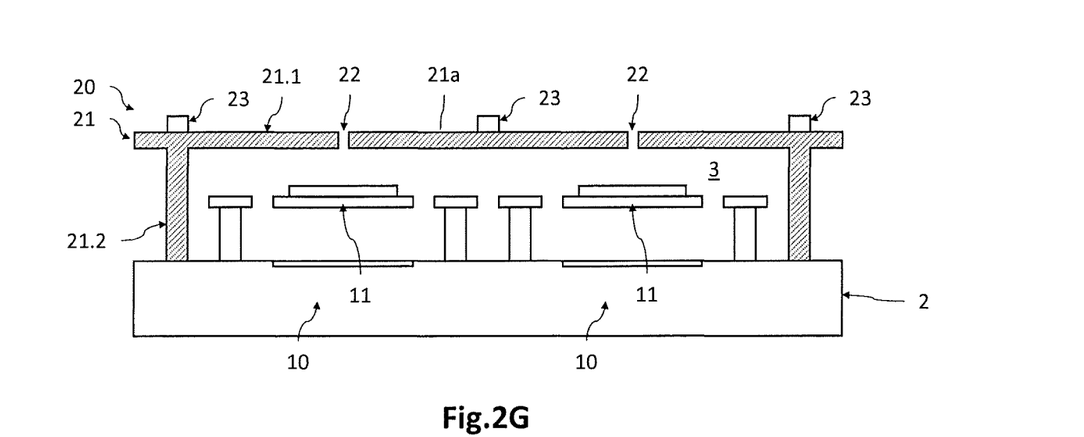

With reference to FIG. 2G, the various sacrificial layers 31, 32 are then removed, here by wet etching in HF vapour in the case of mineral sacrificial layers, through the various release vents, so as to release the absorbent membrane 11 of each thermal detector 10 and to form the cavity 3. Where appropriate, the detecting device 1 is then placed under vacuum or under a low pressure.

Figure 2H:
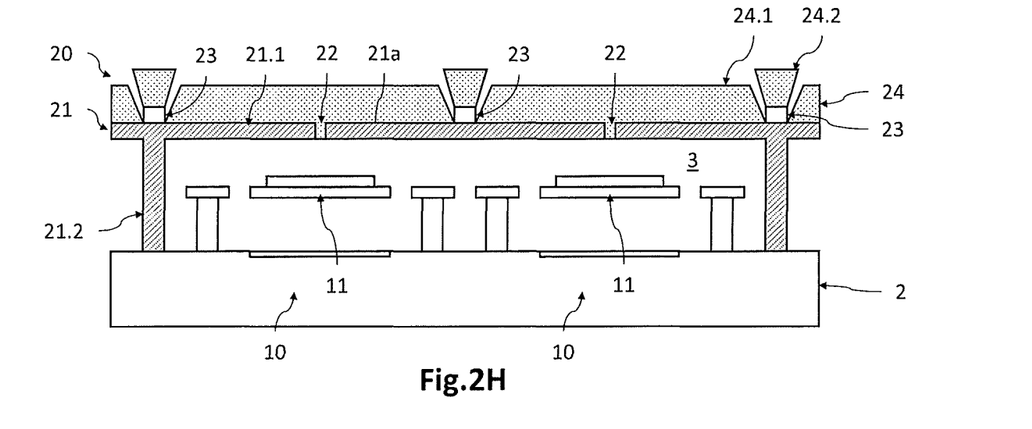
Figure 2I:
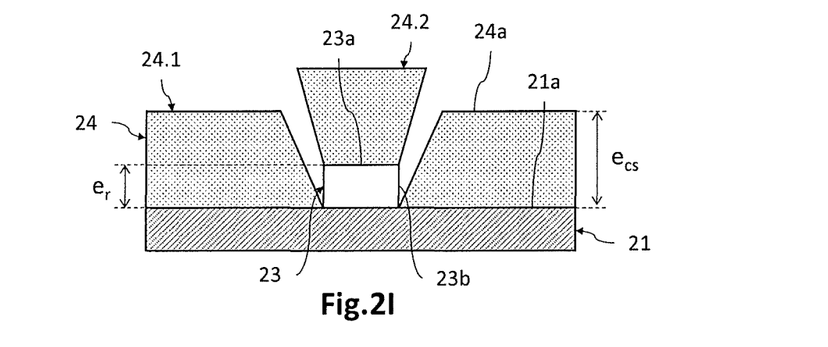

With reference to FIGS. 2H and 2I, the thin sealing layer 24 is then deposited so as to cover the thin encapsulation layer 21 and the relief 23, and so as to block the release vents 22. The thin sealing layer 24 is made of a material that is transparent to the electromagnetic radiation to be detected and of high refractive index, and for example made of germanium or of a silicon-germanium alloy. Its average thickness is here adjusted so as to be substantially equal to an uneven multiple of $\lambda/4n_{cs}$, where $n_{cs}$ is the refractive index of the material of the thin sealing layer 24. By way of example, the thin sealing layer 24 may be made of germanium and have an average thickness equal to about 1800 nm.

The material of the thin sealing layer 24 is different from that of the thin encapsulation layer 21, and has a different coefficient of thermal expansion. By way of example, this may be germanium, the CTE of which is equal to about $5.9 \times 10^{-6}$ K$^{-1}$, which is different, in this example, from the amorphous silicon of the thin encapsulation layer 21, the CTE of which is equal to about $2.6 \times 10^{-6}$ K$^{-1}$.

The deposition is carried out by physical vapour deposition (PVD), and for example by vacuum evaporation, electron-beam evaporation, or cathode sputtering. The PVD deposition amounts to forming a thin layer of a material on the upper face of a receiving area. Thus, the material of the thin sealing layer 24 is deposited on the upper face 21a of the thin encapsulation layer 21 not coated with the relief 23, and on the upper face 23a of the relief 23. The material of the thin sealing layer 24 is substantially not deposited on the lateral faces 23b of the relief 23 (unlike a conformal deposition carried out by chemical vapour deposition), thus leading to the local breakage in the continuity of the thin sealing layer 24. As a result the thin sealing layer 24 is formed from at least one layer segment 24.1 that rests on the thin encapsulation layer 21, and from at least one pad 24.2 that rests on the relief 23, here a longitudinal pad taking the form of a strip. Each layer segment 24.1 is separate and therefore without continuity of material with the adjacent longitudinal pads 24.2. In other words, there is a physical separation between each layer segment 24.1 and the one or more adjacent pads 24.2 (and vice versa).

If the relief 23 forms a continuous two-dimensional array about the thermal detectors 10, the longitudinal pads 24.2 join one another and also form a continuous array superposed with that of the relief 23. There is then a breakage in continuity, i.e. a physical separation, between the longitudinal pads 24.2 on the one hand, and the one or more adjacent layer segments 24.1 on the other hand. Moreover, the adjacent layer segments 24.1 are separated from each other in the plane XY.

It will be understood that a breakage in the continuity of a layer differs from a simple breakage in the planarity of the layer because of the relief 23. What is described here differs from the disclosure of prior-art documents, which for example describe the conformal deposition of a layer on a planar surface coated locally with a relief. This deposited layer may then extend continuously over the planar surface and the faces of the relief. In this case, the relief leads to a rupture in the planarity of the deposited layer in an XY-plane, and not to a breakage in the continuity of the layer. In other words, the portion of the layer located on the relief is not separate (physically separated) from the portion of the layer located on the planar surface.

Moreover, the local rupture in continuity may be reinforced by a shadowing effect associated with the pads 24.2 resting on the relief 23. Specifically, because of the quasi-unidirectionality of the emission of the PVD source of the material to be deposited, in particular during a deposition by evaporation, the pads 24.2 have a cross section that flares in the +Z-direction, i.e. the width in the XY-plane increases with distance from the relief 23 in the +Z-direction. This flaring of the pads 24.2 results in a narrowing of the layer segments 24.1 in the +Z-direction. This shadowing effect reinforces the local breakage in the continuity of the thin encapsulation layer 21.

As a result, because of the presence of the relief 23 the average thickness $e_r$ is chosen depending on that $e_{cs}$ of the thin sealing layer 24, a local breakage in the continuity of the thin sealing layer 24 forms at the relief 23. Thus, the thin sealing layer 24 has a discontinuity in material in the XY-plane, this forming a zone of relaxation of the mechanical stresses resulting from the difference in the coefficients of thermal expansion between the materials of the thin encapsulation and sealing layers 21, 24. The mechanical strength of the encapsulation structure 20 is then improved.

It is particularly advantageous for the relief 23 to form a two-dimensional array continuously bounding each of the thermal detectors 10. Thus, the deposited thin sealing layer 24 is then formed from a plurality of layer segments 24.1, which are separate from one another and separate from the adjacent pads 24.2, and which are each placed facing one thermal detector 10. The zone of relaxation of the mechanical stresses then encircles each segment 24.1 of thin sealing layer 24, this further improving the mechanical strength of the encapsulation structure 20.

Figure 2J:
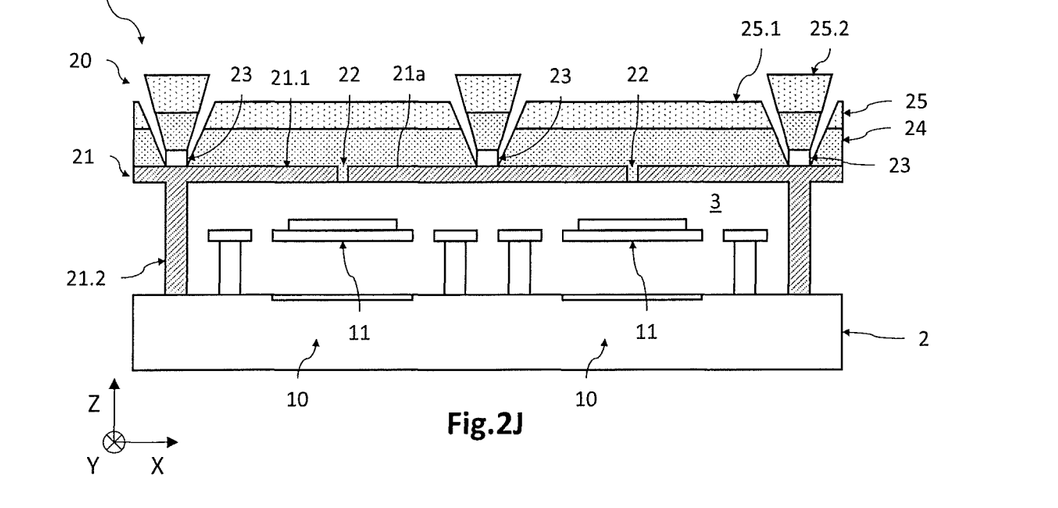

With reference to FIG. 2J, a thin antireflection layer 25, which is deposited by PVD so as to cover the thin sealing layer 24, is then preferably produced. Because of the local breakage in the continuity of the thin sealing layer 25 and the deposition technique used, i.e. PVD, the thin antireflection layer 24 also contains a local breakage in continuity. It is here formed from layer segments 25.1 that are separate from one another and that cover the segments 24.1 of the thin sealing layer 24, and from longitudinal pads 25.2 that are separate and that cover the subjacent longitudinal pads 24.2 of the thin sealing layer 24. The thin antireflection layer 25 may be made of ZnS and have an average thickness between a few hundred nanometres and a few microns, and for example equal to about 1.2 μm in the context of the detection of LWIR radiation.

Thus, the fabricating process allows a detecting device 1 of which the encapsulation structure 20 has an improved mechanical strength to be obtained. It advantageously allows the thin sealing layer 24 and the thin antireflection layer 25 to be produced in the form of a plurality of layer segments 24.1, 25.1 that are separate from one another, i.e. without continuity of material therebetween in the XY-plane. The mechanical stresses resulting from the difference between the CTEs of the various materials of the encapsulation structure 20 may then relax effectively. The encapsulation structure 20 then has an improved mechanical strength during its thermal exposure to high temperatures, such as for example the activation at about 300° C. of a getter material located in the cavity 3, this getter material being intended to react with residual gas potentially present in the cavity 3, in order to keep the latter at a sufficient vacuum level. It may also be a question of the step of depositing the thin sealing layer 24 and/or the thin antireflection layer 25, or even of the brazing step used to seal the unitary detection chips in packages, etc.

This fabricating process makes it possible to avoid having to implement, to obtain the local breakage in continuity, a specific step of localized etching of the thin sealing layer 24, and, where appropriate, of the thin antireflection layer 25, said layers having been deposited on a thin encapsulation layer 21 comprising no relief 23 with a thickness chosen to obtain such an effect, for example in the configuration of FIG. 1. It furthermore makes it possible to avoid the drawbacks that could result from such localized etching.

Specifically, it would be possible to carry out localized wet etching of the thin sealing and antireflection layers, the latter extending in a planar manner over the thin encapsulation layer 21. However, the isotropic character of a wet etch may lead to a sideways etch of the order of two times the thickness of the thin layers to be etched. Thus, for a total average thickness of the thin sealing and antireflection layers of the order of about 3000 nm, a trench having a transverse dimension of about 6 μm in the XY-plane would be obtained, which would have an unacceptable effect on the performance of the detecting device 1, in particular in the case where the pitch of the pixels of the matrix array of thermal detectors 10 is of the order of 12 μm or less.

Moreover, it would also be possible to carry out localized dry etching (for example localized plasma etching) of the thin sealing and antireflection layers. However, the material used to produce the thin sealing layer 24 may have a low etch selectivity with respect to the material of the thin encapsulation layer 21, as is the case for germanium with respect to amorphous silicon. The dry etching would then be controlled timewise, this possibly then leading either to an only partial etch of the thin sealing layer 24, and therefore to an absence of local breakage in continuity, or to a complete etch of the thin sealing layer 24, but also to a (partial) etch of the thin encapsulation layer 21, which would then lead to an even greater decrease in the mechanical strength of the encapsulation structure 20. To mitigate the absence of etch selectivity between the materials of the thin encapsulation and sealing layers, a thin etch-stop layer could be inserted between the two thin layers, but at the price of a degradation in the performance of the detecting device 1 in so far as the material of the thin etch-stop layer may absorb a non-zero proportion of the electromagnetic radiation to be detected.

The fabricating process according to the invention thus allows the mechanical strength of the encapsulation structure 20 to be improved by generating a local breakage in the continuity of the thin sealing layer 24, and, where appropriate, of the thin antireflection layer 25, via the presence of the relief 23 with a thickness chosen to this end. It is unnecessary to have recourse to a specific step of localized etching of the thin sealing and antireflection layers, this notably allowing the performance of the detecting device 1 to be preserved.

Particular embodiments have just been described. Various variants and modifications will be apparent to those skilled in the art.

The invention claimed is:

1. A process for fabricating a device for detecting electromagnetic radiation comprising at least one thermal detector resting on a substrate and one encapsulation structure defining, with the substrate, a cavity in which the at least one thermal detector is located, comprising the following steps:

producing the at least one thermal detector from at least one first sacrificial layer deposited on the substrate;

producing a thin encapsulation layer of the encapsulation structure extending above the at least one thermal detector from at least one second sacrificial layer resting on the at least one first sacrificial layer, the thin encapsulation layer being made of an encapsulation material;

producing, by physical vapour deposition, a thin sealing layer covering the thin encapsulation layer, the thin sealing layer being made of a sealing material having a coefficient of thermal expansion different from that of the encapsulation material;

wherein it furthermore comprises the following step:

prior to the step of producing the thin sealing layer, producing at least one relief structure on the thin encapsulation layer having an average thickness so that, during the deposition of the thin sealing layer, the thin sealing layer is formed from at least one layer segment resting on the thin encapsulation layer and from at least one pad separated from the at least one layer segment and resting on the at least one relief structure, thus forming a local breakage in the continuity of the thin sealing layer at the at least one relief structure.

2. The process for fabricating the device according to claim 1, wherein the at least one relief structure forms, in orthogonal projection with respect to the substrate, a two-dimensional array of longitudinal segments at least partially encircling the at least one thermal detector.

3. The process for fabricating the device according to claim 2, wherein, in orthogonal projection with respect to the substrate, the two-dimensional array of longitudinal segments of the at least one relief structure encircles the at least one thermal detector continuously, so that the at least one pad extends continuously over the two-dimensional array of longitudinal segments of the at least one relief structure and is separate from the at least one layer segment encircled by the two-dimensional array of longitudinal segments of the at least one relief structure.

4. The process for fabricating the device according to claim 1, wherein the at least one thermal detector comprises an absorbent membrane suspended above the substrate and containing a thermometric transducer, the at least one relief structure being placed at a distance, in orthogonal projection with respect to the substrate, from the absorbent membrane.

5. The process for fabricating the device according to claim 1, wherein the thin sealing layer has an average thickness $e_{cs}$, the at least one relief structure having an average thickness $e_r$ larger than or equal to one fifth of the average thickness $e_{cs}$.

6. The process for fabricating the device according to claim 1, wherein the step of producing the at least one relief structure comprises depositing a first layer made of a material different from that of the thin encapsulation layer, then locally structuring the first layer by etching it selectively vis-à-vis the thin encapsulation layer so as to form the at least one relief structure.

7. The process for fabricating the device according to claim 1, wherein the device for detecting comprises a matrix array of thermal detectors placed in said cavity, the at least one relief structure forming a two-dimensional array of longitudinal segments at least partially encircling each of the thermal detectors in orthogonal projection with respect to the substrate.

8. The process for fabricating the device according to claim 1, wherein the thin encapsulation layer is silicon-based and the thin sealing layer is germanium-based.

9. The process for fabricating the device according to claim 1, wherein the thin sealing layer is deposited by evaporation.

10. The process for fabricating the device according to claim 1, comprising a step of producing a thin antireflection layer by physical vapour deposition on the thin sealing layer, the thin antireflection layer then having a local breakage in continuity.

11. The process for fabricating the device according to claim 1, comprising:
  between the step of producing the at least one relief structure and the step of producing the thin sealing layer, a step of forming at least one through-orifice called the release vent through the thin encapsulation layer, the thin sealing layer then being produced so as to block the release vent,
  a step of removing the at least one first and second sacrificial layers through the release vent.

* * * * *